United States Patent [19]

Janz

[11] Patent Number: 4,760,319

[45] Date of Patent: Jul. 26, 1988

[54] CIRCUIT FOR REMOVING UNWANTED SLOPE TRANSITIONS FROM AN INCOMING SIGNAL

[75] Inventor: Donald W. Janz, Oklahoma City, Okla.

[73] Assignee: Magnetic Peripherals Inc., Minneapolis, Minn.

[21] Appl. No.: 20,289

[22] Filed: Feb. 27, 1987

[51] Int. Cl.[4] .............................................. G05B 5/01
[52] U.S. Cl. ................................... 318/616; 318/615; 307/260; 307/261
[58] Field of Search ................................ 307/261–262, 307/351–353; 340/347; 318/561, 608, 616, 617, 615, 600–602

[56] References Cited

U.S. PATENT DOCUMENTS

| | | | |
|---|---|---|---|
| 3,708,737 | 1/1973 | Johnson | 318/616 |
| 3,863,080 | 1/1975 | Steekler | 307/235 R |
| 4,130,786 | 12/1978 | Jacques | 318/561 |
| 4,300,081 | 11/1981 | Van Landingham | 318/616 |
| 4,316,155 | 2/1982 | Hanislco | 307/261 |
| 4,321,517 | 3/1982 | Touchton et al. | 318/616 |
| 4,366,422 | 12/1982 | Rhodes | 318/616 |
| 4,418,305 | 11/1983 | Otsuki et al. | 318/616 |
| 4,480,217 | 10/1984 | Robbins et al. | 318/618 |
| 4,514,672 | 4/1985 | O'Gwynn | 318/616 |
| 4,553,052 | 11/1985 | Takahashi | 307/494 |
| 4,584,559 | 4/1986 | Penny | 340/347 |
| 4,617,521 | 10/1986 | Fox | 329/50 |
| 4,651,034 | 3/1987 | Sato | 307/352 |
| 4,659,972 | 4/1987 | Uchikoshi et al. | 318/616 |

Primary Examiner—William M. Shoop, Jr.
Assistant Examiner—David Martin
Attorney, Agent, or Firm—J. A. Genovese; M. B. Atlass

[57] ABSTRACT

Provided is a circuit for removing an unwanted temporal portion of an incoming signal and for differentiating that signal with respect to a reference voltage level. It includes an input for receiving the incoming signal current through an input capacitor, a differential amplifier for converting input charging current into a voltage with respect to a reference voltage, and a charging capacitor for holding a voltage level representative of the charging current supplied to the differential amplifier during times when the unwanted input signal portion is to be removed from the circuit's output. A current sink and source provides a reset period voltage charge to the input capacitor during times when the unwanted portion is to be removed from the outgoing signal. A switch responds to a reset signal immediately preceding or on the occurrence of the unwanted signal portion. The charging capacitor is charged during the gradually sloping portion of the incoming signal so as to hold a voltage level representative of the incoming charging current when the rapid slope transition (unwanted signal portion) occurs. During such time the reset signal causes the switch to allow the charging capacitor to provide its stored voltage level via the current sink and source to the differential amplifier and input capacitor.

21 Claims, 7 Drawing Sheets

D,U,T SEQUENCE (HEAD-OUT) →
T,U,D SEQUENCE (HEAD-IN) ←

CIRCUIT FOR REMOVING UNWANTED SLOPE TRANSITIONS FROM AN INCOMING SIGNAL

BACKGROUND

This invention relates to signal processing techniques and circuits which remove an unwanted segment from a signal and it has particular application to deriving such a signal for driving servo-mechanisms where the unprocessed signal contains undesirable portions. It is particularly useful for signals in which the desired portion of the signal contains a leg of relatively mild slope and a rapid leg of relatively large opposite slope This circuit has particular application to deriving useful velocity formation from the "tri-phase servo patterns" as described in U.S. patent application Ser. No. 932,814 (which is still pending) which is a continuation in part of U.S. patent application No. 800,019 (now abandoned). The disclosure of these cases is incorporated herein by this reference.

This specification assumes some familiarity with the construction of magnetic disk drive data storage systems and means for generating and using servo information from coded information on the disk media but its teachings can be applied to analogous art as well.

In the specific which this invention was developed, removing unwanted signal portions and differentiating this signal with respect to a reference voltage provides a continuously accurate, useable, linear velocity signal corresponding to the radial speed and direction of the servo reading head (which provides the original input for this signal). Where this reading head is mechanically (or otherwise) linked to other heads traveling over data disks the information is directly indicative of their radial speed also.

An example of a system for generating a continuous servo signal is printed in U.S. Pat. No. 4,130,786 issued to Jacques (and incorporated herein by this reference). The Jacques' patent uses two-phase signals to generate a saw-tooth waveform and adds this saw-tooth waveform with a staircase waveform also generated by reference to the two-phase signal The result is a continuous slope linear signal.

It has also been known to charge a capacitor in a circuit and employ the discharge to smooth a signal, as for example in U.S. Pat. No. 4,584,559, issued to Penny and incorporated herein by reference. Penny does not provide for differentiation of the input signal. In addition, the Penny circuit contains offset errors contributed by two op amps (mainly from 56 and 52 with minor contribution from 48). The present invention only contains offset errors contributed by one op amp (U1-A, with minimum contribution from U1-B).

SUMMARY OF THE INVENTION

This invention produces a differentiated signal representing a velocity with a stair-step after a reset interval proportional to the relatively slower slope of a sawtooth wave signal which is the input signal. In the context of the device for which it was developed, it synthesizes a useful differentiated signal during "reset" intervals.

The input signal builds a voltage level $V_H$ substantially representing the current through an input capacitor and is located between two input resistors on the signal voltage input line, presenting the signal's time varying voltage for processing (in this case by differential amplifier also called an op amp, which yields a signal representing a difference from a reference voltage). Between the occurrences of the unwanted signal portion (in this case between the reset intervals) a second op amp receiving the $V_H$ voltage as positive input creates a voltage level to be stored by a second (storage) capacitor which will then hold a voltage level representative of the input signal current.

During unwanted signal portions (in the preferred embodiment), the voltage level of the input signal changes rapidly. A "reset" signal switches the output of the second op amp to a circuit having an amplifier gain adjusted to produce the appropriate output voltage level from the representative voltage level input to it via the second op amp. This gain adjusted output is provided to cover the input signal until the reset signal pulse is over.

To use an op amp for differentiation the op amp would have its negative input tied to its output via a resistor and the input signal line would have a capacitor in it. For this circuit, resistors R2 and R3 and a capacitor C2 located between them and tying the reference voltage line to the other side of C2, they then act as an additional filter to prevent saturation of U1-A on the occurrence of high noise signals.

The reset signal is derived from the tri-phase servo pattern (disclosed in cited application) and is responsive to it. It is triggered upon the crossing points of the upward-going slopes of, for example, the first of the three tri-phase signals with the downward-going slope of the third. The circuit could, of course, be used in any device in which a rapid slope transition on an incoming signal must be removed from influencing the processed outgoing signal. For any application, it is assumed that the unwanted portions will have some inherent indicator of their occurrence so that a reset signal may be derived therefrom.

DETAILED DESCRIPTION OF PREFERRED EMBODIMENT

Figure 1:
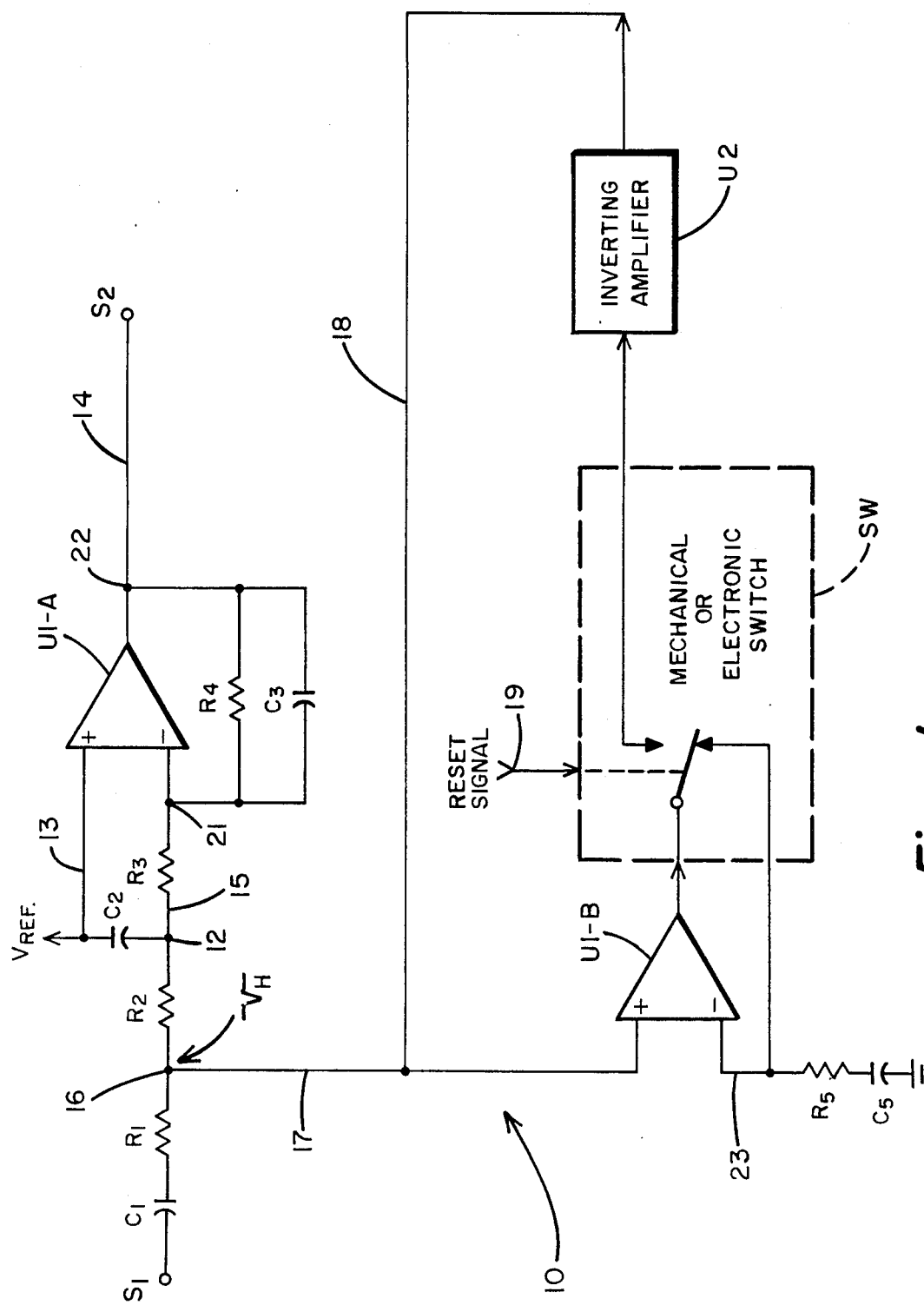
FIG. 1 is a simplified diagram of the circuit employed in the preferred embodiment.

In FIG. 1, a simplified diagram is presented detailing the relevant features of the preferred embodiment circuit 10. (The term "line" is used herein to denote electrical connection via wire or other means.) The signal is input to the circuit 10 at point S1 charging capacitor C1 and thence through resistors R1, R2, and R3 to the negative input of op amp U1-A. The line between resistor R3 and the negative input to op amp U1-A is also linked to resistor R4 and capacitor C3 which are connected in parallel between the point 21 and point 22, on line 14. Line 14 is the output of op amp U1-A provided as output from circuit 10 a point S2. The positive input on line 13 to op amp U1-A provides a reference voltage and is connected across capacitor C2 to point 12 on the signal input line. Between resistors R1 and R2 on the signal input line, a point 16 connects line 17 to positive input of op amp U1-B. Line 17 is also connected to line 18. The negative input of op amp U1-B is connected to ground (GND) through resistor R5 and capacitor C5 (on line 23). The output of op amp U1-B is selectively connected between; (a), a point on line 23 between the negative input to op amp U1-B and resistor R5, and (b), approximate minus one amplifier U2. The selection is governed by a reset signal provided on line 19 to the mechanical or electronic switch SW. On the occurrence of a reset signal on line 19, the switch directs the output of op amp U1-B to the approximate minus one amplifier U2. After the reset signal indicates that the reset is no longer occurring, the switch is set to provide the output of op amp U1-B to line 23. The output of the amplifier U2 is provided on line 18 to its connection to line 17.

The differentiator with hold while reset functions as follows.

Figure 3:
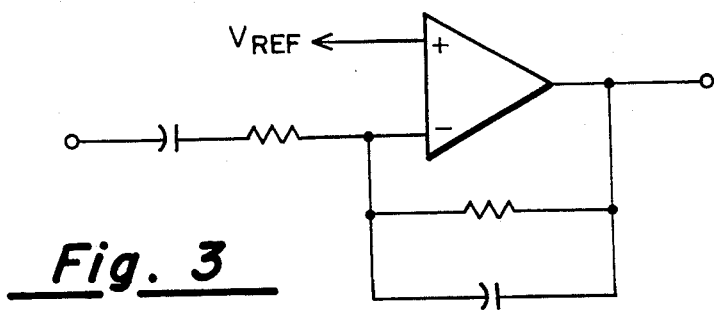
FIG. 3 is a diagram of a typical practical differentiator. Alphanumeric indicator correspondence with elements of FIGS. 1 and 1A means similar structure or function is portrayed.

The input signal charges capacitor C1 and provides a voltage level VH at point 16 which represents the charging current through C1. (Referring briefly to FIG. 3, it will be noted that resistors R2 and R3 and capacitor C2 are additions to this circuit which are not found in the typical practical differentiator of FIG. 3.)

Note that op amp U1-A connected as shown will tend to stabilize itself at a point where the voltage on the negative input is brought up to the level of voltage on the positive input ($V_{REF}$). Therefore, op amp U1-A's output voltage will tend to be proportional to $V_H$. It should be recognized that because the changes in $V_H$ may be very small (about 0.1 millivolt) any ambient current leakage will affect the circuit performance. This fact must be considered in component choice, described in detail within, with reference to FIG. 1A.

The voltage $V_H$ on line 17 is provided as positive input to operational amplifier U1-B. During the normal operation of the circuit when the wanted portion of the signal is provided as input on S1 and no reset signal is present on line 19, the output of op amp U1-B is provided to line 23 as input to the negative input of op amp U1-B and through resistor R5 to capacitor C5 and to ground, or as in the preferred embodiment may employ a 5 volt reference in place of the ground. (Resistor R5 can provide filtering to the voltage provided to capacitor C5, as shown, if desired.) On the occurrence of a reset signal the mechanical or electronic switch SW transfers the output of op amp U1-B to the approximate minus one amplifier U2. Thus the voltage level on capacitor C5 provides an error voltage to the minus one amplifier U2 which provides a voltage level equal to the voltage level on capacitor C5 on line 18 to line 17 and to point 16, thus sustaining the voltage level to the negative input of op amp U1-A during the reset interval.

Figure 1A:
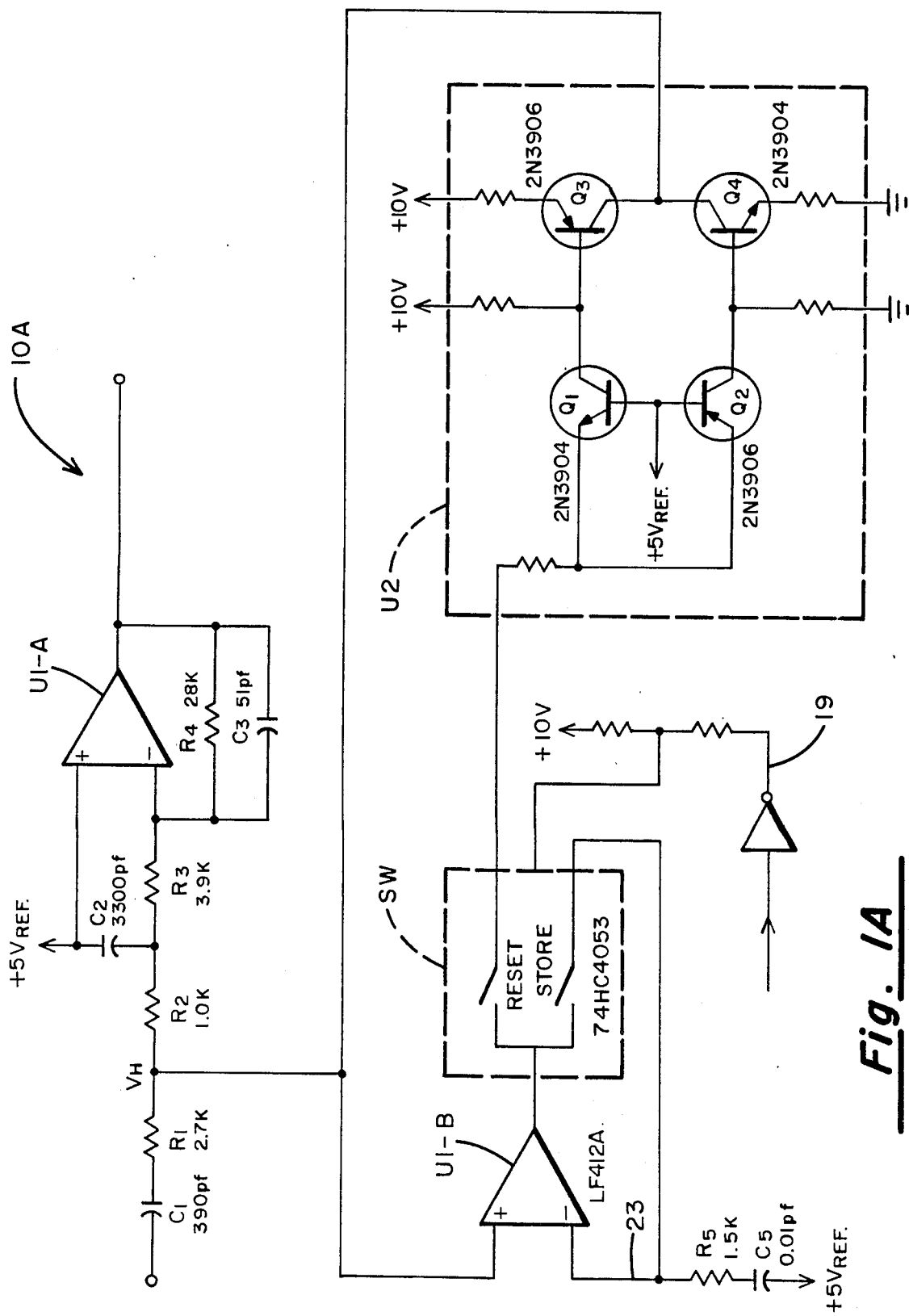
FIG. 1A is a detailed diagram of the circuit of the preferred embodiment. Where Alphanumeric indicators on this Figure which are the same as those in FIG. 1, the element indicated is or represents the same structure or provides the same function as the element with the corresponding indicator in FIG. 1A.

A more detailed schematic diagram is provided in FIG. 1A in which the resistance and capacitance values are provided and references made to standard industrial use numbers for designating particular integrated circuit and other component parts. As with FIG. 3 identical numerals correspond to the same elements.

Referring now to FIG. 1A, a circuit 10A is provided to show the details of the preferred embodiment circuit used in this invention. Reference numerals in this circuit, which correspond to reference numerals in circuit 10 of FIG. 1A, indicate a correspondence of function. Resistance, capacitance, and voltage values may be varied in accord with principles known to those in the art without deviation from the inventive concepts described herein. Certain characteristics of some of the devices pictured, however, are important to prevent problems with ambient voltage affecting the performance of the differentiation characteristics of op amp U1-A. For instance, the circuit elements designated U2 comprise a low leakage, high output impedance inverter amplifier when not operating so transistors Q3 and Q4, for instance, must be low leakage transistors. The numbers 2N3904 designate transistors of this type to one of ordinary skill in the industry. Likewise, op amp U1-B, designated by the industry standard number LF412A (currently available through National Semiconductor Corp.), is high speed op amp with high input impedance (100 pico amp input), which will have no leakage current to affect the operation of U1-A, which will most likely be on the same circuit board.

Figure 4:
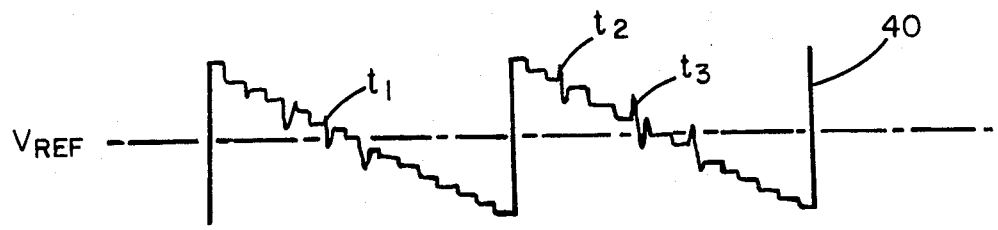
FIG. 4 is a graph of a nonideal input signal.

FIG. 4 illustrates a small segment of a possible nonideal input signal. This signal would correspond to some portion of the $WF_1$ waveform of FIG. 2. Because the signal is originally generated by digital circuits in the preferred embodiment, it takes on a stairstep form as shown. Due probably primarily to irregularities on the data disk itself, transients or spikes $t_1$, $t_2$, and $t_3$ will often be found in the preferred embodiment, nonideal input signal. These transients, as well as the stairstep configuration of the input signal, will be smooth and filtered out by the circuit described herein. (The curve described by numeral 40 is the signal with reference to the $V_{REF}$ or reference voltage level in FIG. 4.)

It must be noted that the reference voltages need not be the same DC potential for any of the three points to which they are introduced into the circuit, however the potential vlaues must be constant. A reference voltage of 5 volts for the op amp positive input worked best with the preferred embodiment to achieve the greatest dynamic range for the power supplies used.

Figure 5:
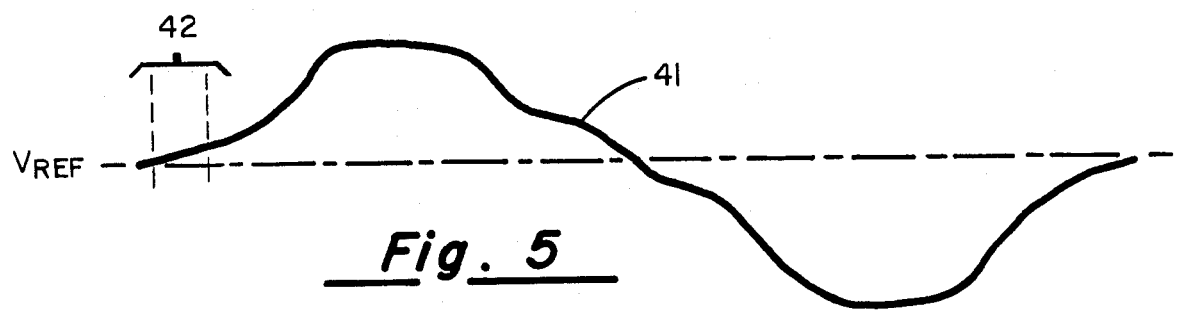
FIG. 5 is a graph of a possible ideal output signal.

FIG. 5 describes by curve 41 a possible ideal output signal. Segment 42 would correspond to the negative output signal portion described by line $WF_3$ in FIG. 2.

Figure 2:
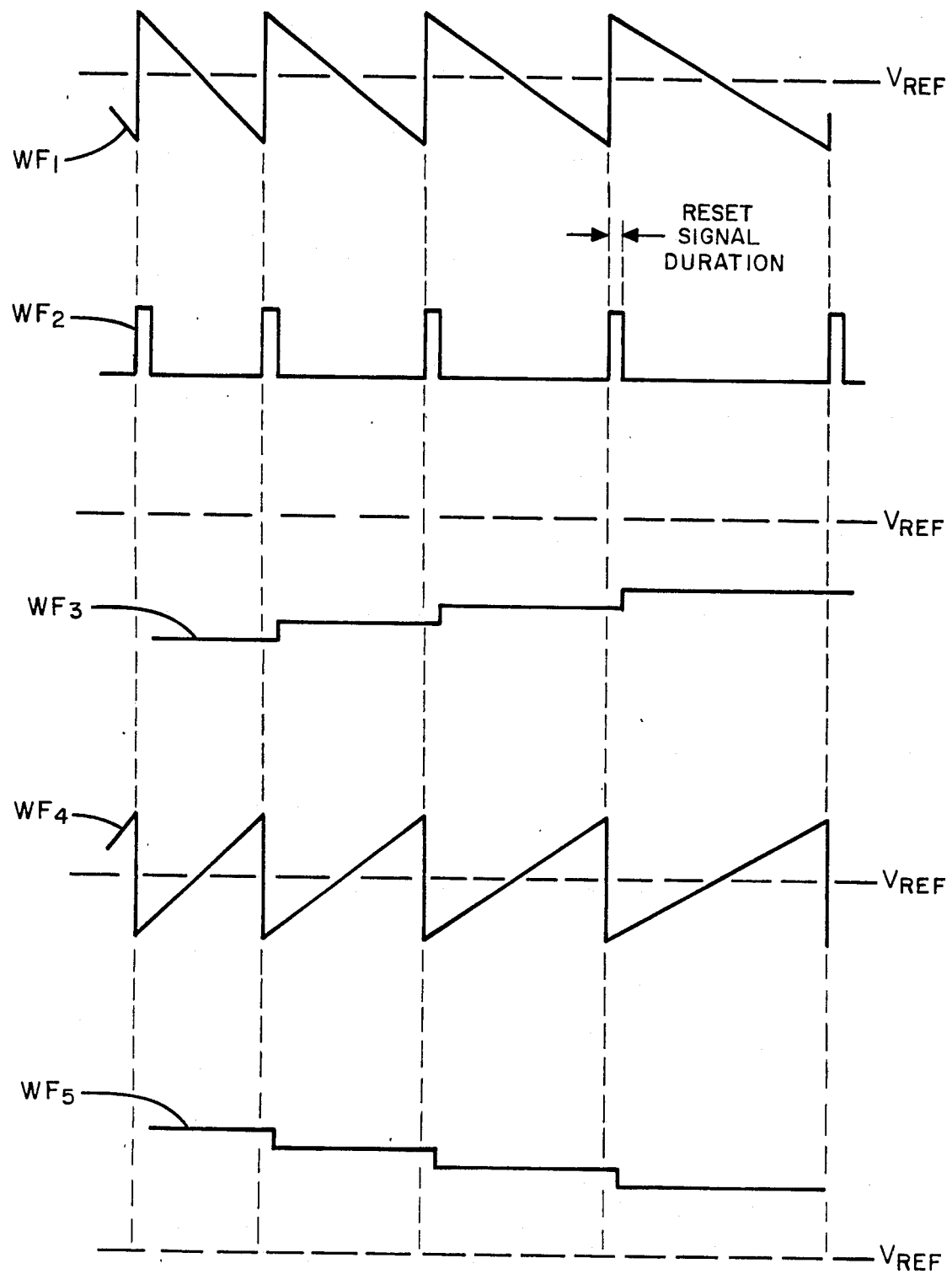
FIG. 2 is a graph with a set of voltage signals with respect to time.

There are five waveforms illustrated in FIG. 2, including:
  WF-1, an input signal with a negative going slope and a positive slope transition;
  WF-2, the reset signal, consisting of a series of pulses indicating the time period for the slope transition;
  WF-3, being the negative output signal provided on signal output point S2 for the negative slope input WF-1;
  WF-4, which is an input signal of positive slope and its corresponding output for positive output WF-5.

All these waveform signals occur over the same length of time and the voltage value is plotted against a voltage reference level as illustrated by the lines marked $V_{REF}$. $WF_1$, $WF_2$, and $WF_3$ may occur concurrently, and $WF_4$, $WF_5$, and $WF_2$ may also occur concurrently, using this invention.

Deriving the Reset Signal

Figure 6:
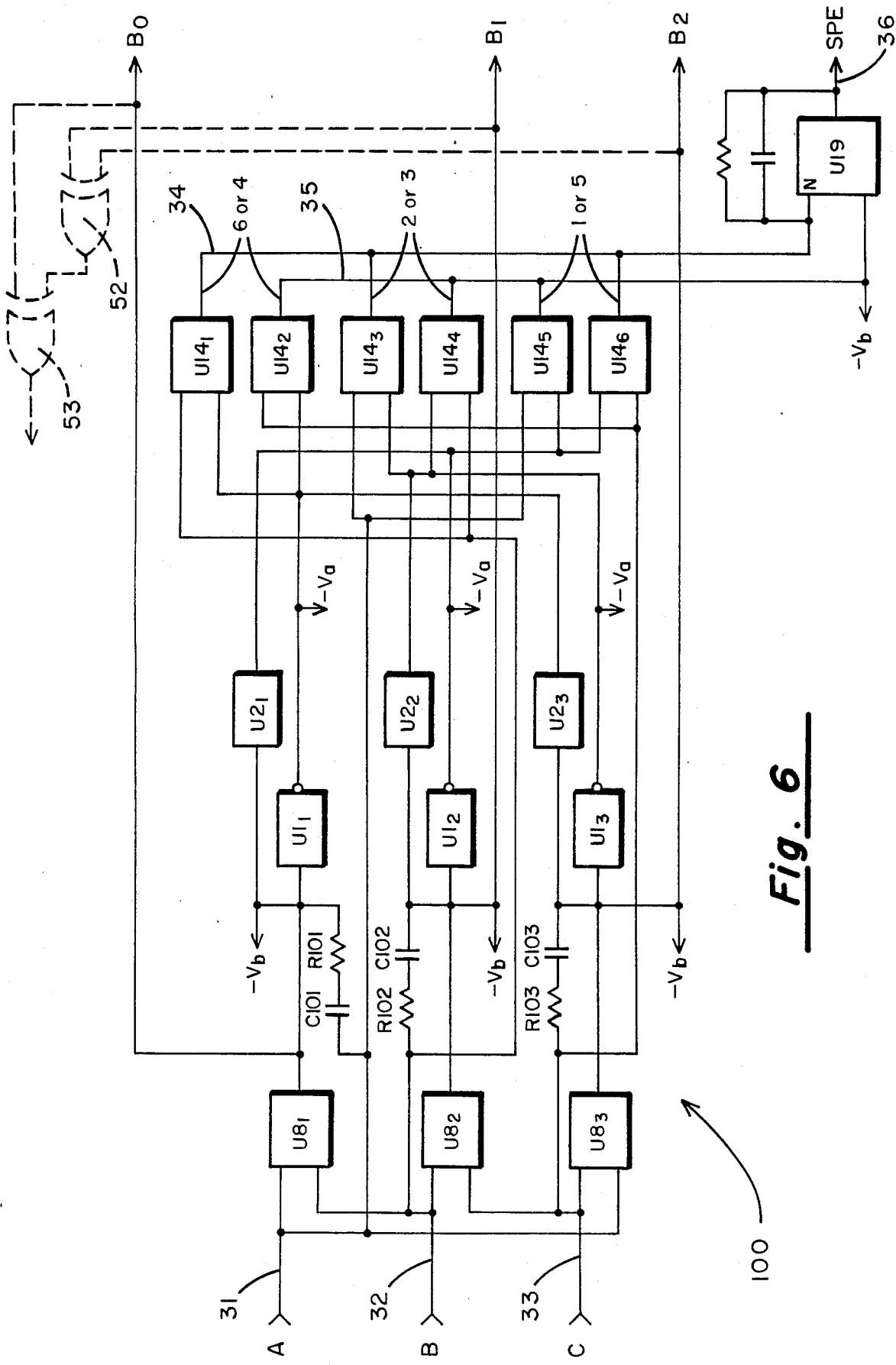
FIG. 6 is a diagram of a circuit for deriving the digital pulse stream for deriving a reset signal from a tri-phase servo pattern.

Referring now to FIG. 6, a circuit diagram is provided for circuit 100 through which the reset signal may be derived from the tri-phase signal input in the preferred embodiment use of this invention. Three triangle wave signals A, B, and C, are provided on lines 31, 32, and 33, respectively. The triangle waves are derived from tri-phase spaced signals located in the formatted data disk used with the prepared embodiment as described in the aforementioned currently pending patent applications. Circuit 100 of FIG. 6 provides the signal input at S1 of FIGS. 1 and 1A from line 36. A detailed representation of this output signal is found in FIG. 8 and of the tri-phase input signals is found at the top of FIG. 7.

Figure 7:
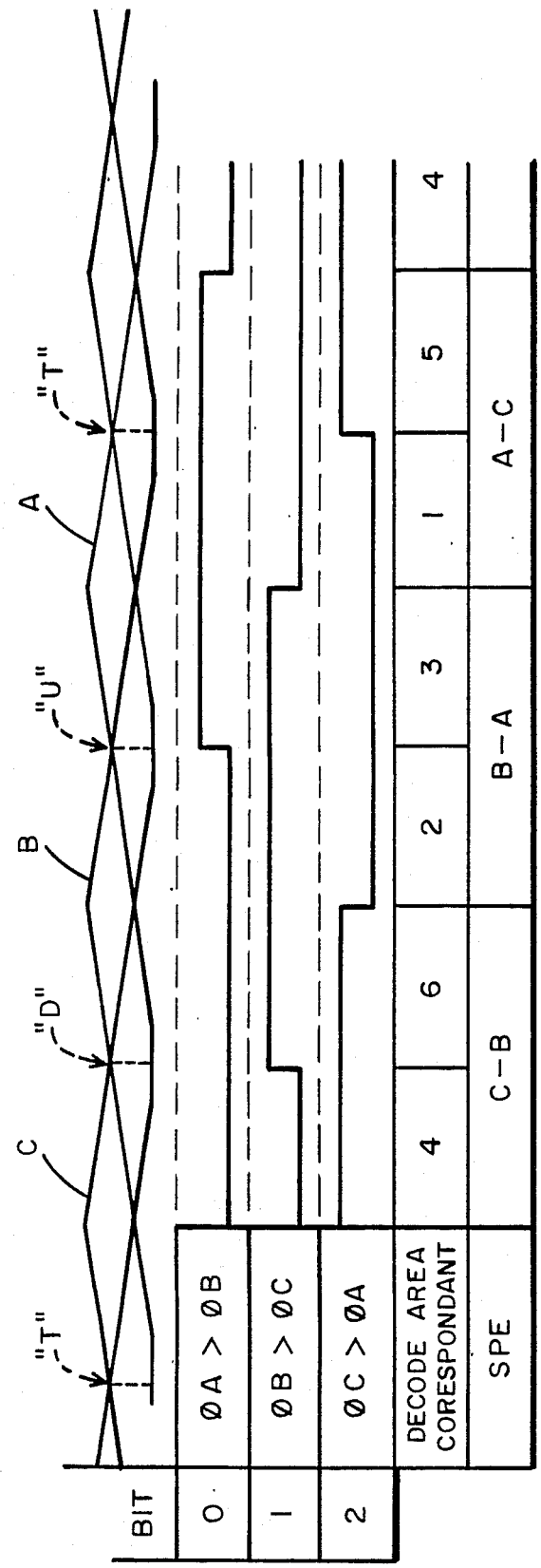
FIG. 7 is a graph of three signals, pairs of which are related to the circuit of FIG. 6.

Note that in FIG. 7, three "bit" signals, 0, 1, and 2 (square wave signals or digital "pulses") are shown in their radial relation to the tri-phase input signals which occur at the same time and radial position. These bit signals 0, 1, and 2 can be found on output lines B0, B1, and B2, respectively. The negative going slope of each one of these three signals produces a reset signal of a finite duration. This could be done with a microprocessor decode of the three bit pulses or, if one is willing to accept only generating reset signals during the head-in (i.e. head moving towards the center of the disk), one could use two EXCLUSIVE-OR gates such as gates 52 and 53 arranged and connected as shown. The preferred embodiment decode circuit is explained with reference to FIG. 9, which generates a reset signal during rapid transition periods in the servo position error signal, but any number of embodiments may be constructed to accomplish this once it is understood. The bit signals used to generate the reset signal are produced by a circuit such as the preferred embodiment circuit 100 of FIG. 6, which acts in the following manner.

The three phase signals (A, B, and C) are compared by the three comparators $U8_1$, $U8_2$, and $U8_3$ as shown. Where the A phase signal (on line 31) is higher voltage than the B phase signal (from line 32), the output of non-inverting buffer circuit $U2_1$ is "hi" and the output of inverting circuit $U1_1$ is "lo". Otherwise, the reverse is the case. The other two comparators and their associated inverting and non-inverting circuits function in the same way for their inputs.

Referring now to FIG. 6 in which the generalized circuit diagram employed by this invention to derive the reset signal is shown, signals A, B, and C are input into the circuit 100 on lines 31, 32, and 33, respectively. In FIG. 7, typical signals A, B, and C, are shown with respect to a reference voltage level $V_{REF}$. One of each of the signals is fed into the positive input of a circuit $U8_1$, $U8_2$, or $U8_3$. One of the other of the three input signals is input into the negative input of these same three comparator circuits. LM339 is the industry standard numerical designation for the U8 circuits used in the preferred embodiment and it is currently a available from National Semiconductor Corp.

Figure 8:
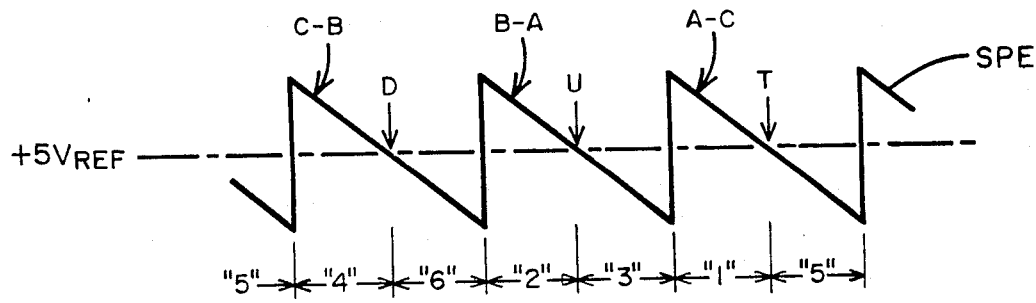
FIG. 8 is a graph of an output signal.

Each one of the input signals (A,B, and C) is also input to two of the six analog switches $U14_{(1-6)}$, to be passed through to inverting and non-inverting differential amplifier input lines 34 and 35, respectively, to create the SPE or servo position error signal shown in FIGS. 7 and 8.

The peak input signals A, B and C input to the comparitors $U8_1$, $U8_2$ and $U8_3$ in turn drive logic inverters $U1_1$, $U1_2$, and $U1_3$, and also drive logic buffers $U2_1$, $U2_2$, and $U2_3$. The output of theses logic inverters and buffers provide the proper switching of the analog switches $U14_{1-6}$. Resistor Capacitor pairs 101,102 and 103 provide hysteresis to the respective comparitors $U8_1$, $U8_2$, and $U8_3$ to prevent multiple switching during noise transients which may appear in the A, B, or C signals.

Circuit U19 is a differential amplifier which produces a signal on line 36 as shown in FIG. 8. The alphanumeric indicators attached to the signal graphed in FIG. 8 (for Head-in sequence) correspond to the decimal or SPE indicators shown in FIG. 7.

The outputs of the U8 circuits produced on bit lines B1, B2, and B0, are shown in FIG. 7, as 0, 1, and 2. Therefore, looking at the signals in a Head-In direction in FIG. 7, because the transition or unwanted signal portion occurs between the areas designated 6 and 2, the areas designated 3 and 1 and the areas designated 5 and 4 (see FIG. 5 and bottom of FIG. 7) and because a downward going pulse occurs at each one of these area interfaces and because only one of the three bit signals is hi at a downward going signal area, all that is necessary is to fire a reset signal at a downward going pulse. Going Head-out, each upward going pulse will signal that a reset signal is necessary; i.e., that the slope transition occurs at that interface. A microprocessor could receive these digital bit signals as input and based on a program generate a reset pulse at the proper upward or downward going transitions of each of the bit signals. It is simplest and most efficient to think of this in terms of two EXCLUSIVE OR gates such as 52 and 53, which will provide an output pulse of relatively short duration in conjunction with a digital one shot for each of the indicated transistors.

In the preferred embodiment, the decode of the Bit signals 0, 1, and 2 is accomplished with the equivalent of three AND gates with an output each to one of three flip-flops whose outputs are OR'd together. The output of this OR would be the reset signal for both Head-In and Head-Out orientations. In practice the reset signal generation is more complicated and is explained with reference to FIG. 9, wherein a circuit 200 to accomplish this is shown, however it should be noted that other decode schemes are produceable and that reset signals may come from things other than the Tri-Phase servo signal of this embodiment.

Figure 9:
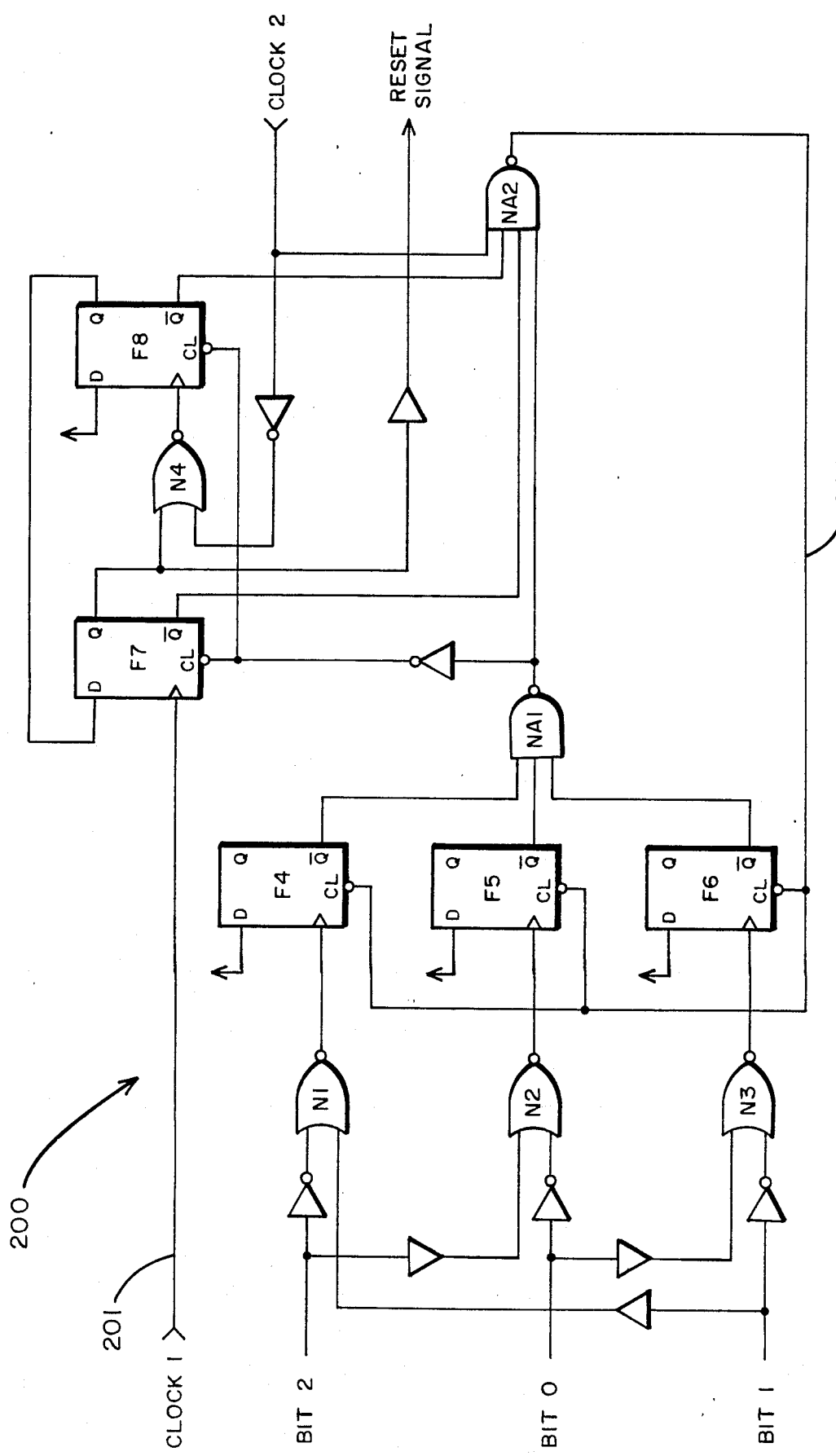
FIG. 9 is a schematic diagram for a circuit for deriving the reset signal in accord with the preferred embodiment.

In FIG. 9, a clock input, which is of a period length smaller than the desired duration of the reset signal, is provided to the circuit at input 201. The clock pulse should be a short portion of the clock period. It (clock 1—see FIG. 10) is provided as the clock input to flip-flop F7. A second clock, clock 2 provides a delayed clock input to NAND gate N2, and its inverse is provided to NOR gate N4.

The Q output of F7 when "lo" provides the Reset signal used in the circuits 10 and 10A to control the switch.

Circuit 200 receives the three "B" or bit outputs of FIG. 6's Circuit 100 (shown in timed relation to each other in FIG. 7) as inputs. They are provided, inverted and non-inverted as input to NOR gates N1, N2, and N3, as shown. The outputs of these NOR's are input to flip-flops F4, F5, and F6. The Q-bar output of these flip-flops is input to NAND gate NA1, whose output is provided as input to NAND gate NA2. The output of NA1 also clears flip-flop F7. NAND gate NA2 also receives the Q-bar output of F7 and the Q-bar output of F8 as input, and on the NAND of these three inputs provides a clear signal to flip-flops F4, F5, and F6. The D inputs of flip-flops F4, F5, F6, and F8 are all tied to a "hi" signal or voltage level as indicated by the arrows attached thereto in the drawing.

Figure 10:
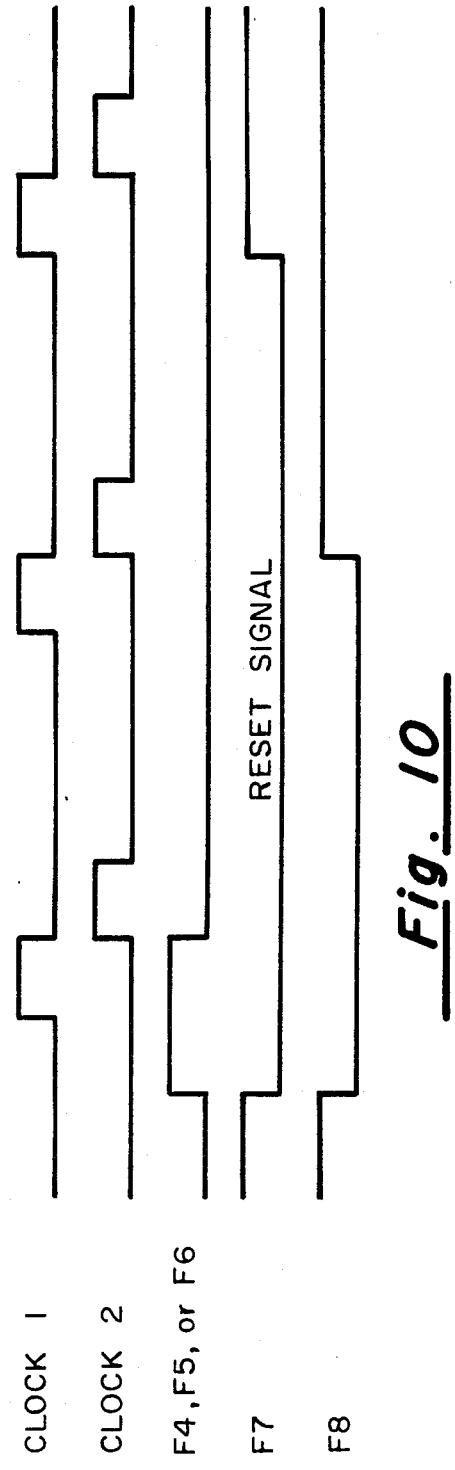
FIG. 10 is a timing diagram for use with FIG. 9.

It should be clear that this circuit schematic in FIG. 9 and its associated timing diagram of FIG. 10 only provide for an efficient decode for the reset signal and is not presented to limit the invention claimed to this circuit.

What is claimed is:

1. A circuit for removing unwanted temporal portions of a voltage varying signal current input thereto on the occurrence of a reset signal and for differentiating the resultant corrected signal with respect to a reference voltage provided by one of at least one reference voltage source wherein said circuit has:
    switch means responsive to said reset signal having as a first input said reset signal and having a second input and having a first and second output, wherein said switch means in response to said reset signal diverts the second input to said second output from said first output and thence returns said second input connection to said first output,
    input capacitor for receiving said input signal current,
    op amp means having a positive and negative input, and an output connected to said second input of said switch, and having said positive input connected to receive voltage representative of the current through said input capacitor by being in electrical connection therewith,
    storage capacitor means having one side connected to any reference voltage and having its other side in electrical connection to said op amp means' negative input and with said first switch output,
    a first resistor,
    a feedback resistor,
    an inverting amplifier means connected to receive said second switch output, and
    second op amp means for receiving the second switch output as a corrected input signal having:
        a negative input which is connected through the first resistor and through the inverting amplifier means to said second switch output and which negative input of said second op amp means is also in electrical connection through said first resistor with said input capacitor and with said positive input of said first op amp means,
        a positive input connected to a reference voltage, and which provides as output, said differentiated corrected signal, and this output is also connected via a feedback resistor to said negative input.

2. A circuit is set forth in claim 1 wherein said reset signal is generated via circuit means for generating a reset signal from a tri-phase servo signal.

3. A circuit is set forth in claim 1 wherein said reset signal is generated via circuit means for generating a reset signal from the same tri-phase servo signal which is used to generate the input signal having unwanted temporal portions.

4. A circuit as set forth in claim 1 wherein said second op amp negative input is also connected to any reference voltage source through the first resistor and thence through a filter capacitor and wherein said filter capacitor is also connected between a second resistor and said first resistor and wherein said second op amp means negative input is in electrical connection through both said first and second resistors to said input capacitor, to said inverting amplifier output, and also to said positive input of said first op amp means.

5. A circuit as set forth in claim 1 wherein the negative input of said second op amp means is in electrical connection to its output via said feedback resistor and compensating capacitor connected in parallel.

6. A circuit as set forth in claim 4 wherein a third resistor is connected between said second resistor and said input capacitor and wherein said input capacitor also through said third resistor connects with said inverting amplifier output and with said first op amp means positive input.

7. A circuit as set forth in claim 5 wherein a third resistor is connected between said second resistor and said input capacitor and wherein said input capacitor also through said third resistor connects with said inverting amplifier and with said first op amp means positive input.

8. A circuit is set forth in claim 4 wherein said reset signal is generated via circuit means for generating a reset signal from a tri-phase servo signal.

9. A circuit is set forth in claim 4 wherein said reset signal is generated via circuit means for generating a reset signal from the same tri-phase servo signal which is used to generate the input signal having unwanted temporal portions.

10. A circuit is set forth in claim 5 wherein said reset signal is generated via circuit means for generating a reset signal from a tri-phase servo signal.

11. A circuit is set forth in claim 5 wherein said reset signal is generated via circuit means for generating a reset signal from the same tri-phase servo signal which is used to generate the input signal having unwanted temporal portions.

12. A circuit as set forth in claim 1 wherein a storage resistor is connected in series with said storage capacitor between said any reference voltage connected to said storage capacitor and said first op amp means negative input.

13. A circuit as set forth in claim 1 wherein a storage resistor is connected between said first switch output at one side and between both said first op amp means negative input and said storage capacitor at the other side.

14. A circuit as set forth in claim 4 wherein a storage resistor is connected in series with said storage capacitor between said any reference voltage connected to said storage capacitor and said first op amp means negative input.

15. A circuit as set forth in claim 4 wherein a storage resistor is connected between said first switch output at one side and between both said first op amp means negative input and said storage capacitor at the other side.

16. A circuit as set forth in claim 5 wherein a storage resistor is connected in series with said storage capacitor between said any reference voltage connected to said storage capacitor and said first op amp means negative input.

17. A circuit as set forth in claim 5 wherein a storage resistor is connected between said first switch output at one side and between both said first op amp means negative input and said storage capacitor at the other side.

18. A circuit as set forth in claim 6 wherein a storage resistor is connected in series with said storage capacitor between said any reference voltage connected to said storage capacitor and said first op amp means negative input.

19. A circuit as set forth in claim 6 wherein a storage resistor is connected between said first switch output at one side and between both said first op amp means negative input and said storage capacitor at the other side.

20. A circuit as set forth in claim 7 wherein a storage resistor is connected in series with said storage capacitor between said any reference voltage connected to said storage capacitor and said first op amp means negative input.

21. A circuit as set forth in claim 7 wherein a storage resistor is connected between said first switch output at one side and between both said first op amp means negative input and said storage capacitor at the other side.

* * * * *